(12) United States Patent
Jang et al.

(10) Patent No.: US 10,790,038 B2
(45) Date of Patent: Sep. 29, 2020

(54) SEMICONDUCTOR APPARATUS AND TEST SYSTEM INCLUDING THE SEMICONDUCTOR APPARATUS

(71) Applicant: SK hynix Inc., Icheon-si, Gyeonggi-do (KR)

(72) Inventors: Soo Young Jang, Seoul (KR); Kyu Bong Kong, Hwaseong-si (KR); Geun Il Lee, Yongin-si (KR); Yong Suk Joo, Yongin-si (KR); Kyung Ho Chu, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 15 days.

(21) Appl. No.: 16/216,748

(22) Filed: Dec. 11, 2018

(65) Prior Publication Data

US 2019/0385689 A1 Dec. 19, 2019

(30) Foreign Application Priority Data

Jun. 19, 2018 (KR) ........................ 10-2018-0070328

(51) Int. Cl.
*G11C 29/10* (2006.01)
*G11C 29/52* (2006.01)
*G11C 7/10* (2006.01)

(52) U.S. Cl.
CPC ............ *G11C 29/10* (2013.01); *G11C 7/1006* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 7,013,413 | B1 * | 3/2006 | Kim | ............ G11C 7/1051 714/48 |
| 8,321,779 | B2 * | 11/2012 | Shin | ............ H03M 13/091 714/807 |
| 9,239,752 | B2 * | 1/2016 | Lee | ............ G06F 11/1004 |
| 9,767,920 | B2 * | 9/2017 | Kim | ............ G11C 29/42 |
| 10,504,606 | B2 * | 12/2019 | Kwon | ............ G11C 29/38 |
| 2008/0056025 | A1 * | 3/2008 | Kanagawa | ............ G06F 11/1044 365/189.15 |
| 2016/0042809 | A1 | 2/2016 | Kim et al. | |
| 2018/0039538 | A1 * | 2/2018 | Freikorn | ............ G06F 11/1048 |
| 2019/0385689 | A1 * | 12/2019 | Jang | ............ G11C 29/52 |
| 2019/0392299 | A1 * | 12/2019 | Ma | ............ G06F 7/5443 |

* cited by examiner

*Primary Examiner* — Phung M Chung
(74) *Attorney, Agent, or Firm* — William Park & Associates Ltd.

(57) ABSTRACT

A semiconductor apparatus includes: a pad unit comprising a plurality of data input/output (I/O) pads and a plurality of error detection code pads; an error detection code (EDC) read path configured to generate a plurality of EDCs by performing an error detection operation on a plurality of data, and output the plurality of EDCs through the plurality of error detection code pads; a comparison circuit configured to generate a comparison result signal by comparing the plurality of EDCs; and a data read path configured to output the comparison result signal through any one of the plurality of data I/O pads.

8 Claims, 6 Drawing Sheets

SEMICONDUCTOR APPARATUS AND TEST SYSTEM INCLUDING THE SEMICONDUCTOR APPARATUS

CROSS-REFERENCES TO RELATED APPLICATION

The present application claims priority under 35 U.S.C. § 119(a) to Korean application number 10-2018-0070328, filed on Jun. 19, 2018, in the Korean Intellectual Property Office, which is incorporated herein by reference in its entirety.

BACKGROUND

1. Technical Field

Various embodiments generally relate to a semiconductor circuit, and more particularly, to a semiconductor apparatus and a test system including the semiconductor apparatus.

2. Related Art

A semiconductor apparatus, for example, a semiconductor memory apparatus needs to test a normal operation of a memory cell array. For example, the semiconductor apparatus needs to test whether data has been normally written or read.

Therefore, the semiconductor apparatus may perform a test by performing a write/read operation according to test data and command which are provided from test equipment coupled to the semiconductor apparatus.

The semiconductor apparatus may perform data input/output through a plurality of data input/output pads (hereafter, referred to as DQ pads) which are coupled one-to-one to a plurality of DQ pins outside a package. Furthermore, the semiconductor apparatus may generate an error detection code (EDC) by detecting whether input/output data contains an error through an error detection operation, for example, a cyclic redundancy check (CRC) operation, and output the generated EDC to the outside of the semiconductor apparatus through error detection pads (hereafter, referred to as EDC pads) which are coupled one-to-one to EDC pins outside the package.

However, general test equipment can be coupled to only specific pads among the DQ pads of the semiconductor apparatus, for example, one pad for each byte, and pins which can be coupled to the EDC pads are not assigned.

Thus, the general test equipment cannot test whether the semiconductor apparatus normally outputs an EDC.

SUMMARY

In an embodiment, a semiconductor apparatus may include: a pad unit including a plurality of data input/output (I/O) pads and a plurality of error detection code pads; an EDC read path configured to generate a plurality of EDCs by performing an error detection operation on a plurality of data, and output the plurality of EDCs through the plurality of error detection code pads; a comparison circuit configured to generate a comparison result signal by comparing the plurality of EDCs; and a data read path configured to output the comparison result signal through any one of the plurality of data I/O pads.

In an embodiment, a semiconductor apparatus may include: a memory cell array; a pad unit including a plurality of data I/O pads and first and second error detection code pads; a write path configured to copy first test data inputted through a first test pad among the plurality of data I/O pads into signal paths of the other pads to write the first test data to the memory cell array, according to a write command and a first test command; and a read path configured to generate first and second EDCs through error detection operations on first and second data outputted from the memory cell array according to a read command, output the first and second EDCs through the first and second error detection code pads, generate a comparison result signal by storing and comparing the first and second EDCs according to a second test command, and output the comparison result signal through the first test pad.

In an embodiment, a test system may include: test equipment configured to provide a plurality of commands and test data; and a semiconductor apparatus including a plurality of data I/O pads and first and second error detection code pads, and configured to receive the test data through a first test pad coupled to the test equipment among the plurality of data I/O pads, write the received test data to a memory cell array, generate a plurality of EDCs by performing error detection operations on a plurality of data outputted from the memory cell array, respectively, and transfer a result obtained by comparing the plurality of EDCs to the test equipment through the first test pad.

DETAILED DESCRIPTION

Hereinafter, a semiconductor apparatus and a test system including the same according to the present disclosure will be described below with reference to the accompanying drawings through examples of embodiments.

Various embodiments may be directed to a semiconductor apparatus capable of performing an EDC test and a test system including the same.

Figure 1:
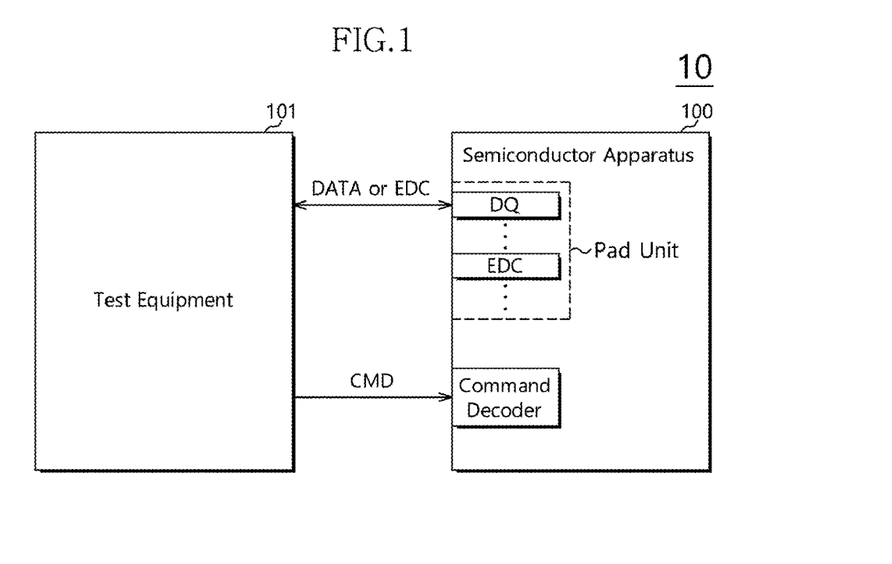
FIG. 1 illustrates the configuration of a test system in accordance with an embodiment.

FIG. 1 illustrates the configuration of a test system in accordance with an embodiment.

As illustrated in FIG. 1, the test system 10 in accordance with an embodiment may include a semiconductor apparatus 100 and test equipment 101 coupled to the semiconductor apparatus 100.

The semiconductor apparatus 100 may decode a command CMD provided from the test equipment 101 through a command decoder, and perform a write and read (write/read) operation based on the decoded command CMD.

The semiconductor apparatus 100 may include a pad unit including a plurality of DQ pads for inputting and outputting (inputting/outputting) data and a plurality of error detection code (EDC) pads for outputting EDCs.

The plurality of DQ pads may be coupled to a plurality of DQ pins (not illustrated) outside a package, and the plurality of EDC pads may also be coupled to a plurality of EDC pins (not illustrated) outside the package.

The semiconductor apparatus 100 may be configured to output compressed data and an EDC (or a result obtained by comparing a plurality of EDCs) through one pad determined among the plurality of DQ pads.

The semiconductor apparatus 100 may provide the compressed data to the test equipment 101 through one pad determined among the plurality of DQ pads, according to any one of a plurality of test commands provided from the test equipment 101.

The semiconductor apparatus 100 may provide the test equipment 101 with the EDC or the result obtained by comparing the plurality of EDCs through one pad determined among the plurality of DQ pads, according to another of the plurality of test commands provided from the test equipment 101.

The test equipment 101 can be coupled to only specific pads among the plurality of DQ pads of the semiconductor apparatus 100, for example, one pad for each byte, and not coupled to the EDC pads of the semiconductor apparatus 100.

The test equipment 101 may provide the semiconductor apparatus 100 with various commands CMD and test data for a test.

The command CMD may selectively include a read command, a write command and a plurality of test commands.

The test equipment 101 may determine whether a signal inputted through a DQ pad of the semiconductor apparatus 100 is general data, compressed data, an EDC or a result obtained by comparing a plurality of EDCs, according to the current operation mode of the semiconductor apparatus 100.

The test equipment 101 may determine the current operation mode based on a command which the test equipment 101 provides to the semiconductor apparatus 100.

FIG. 1 illustrates an example in which one semiconductor apparatus 100 is coupled to the test equipment 101. In reality, however, a plurality of semiconductor apparatuses 100 may be coupled to the test equipment 101, depending on the number of channels included in the test equipment 101.

Figure 2:
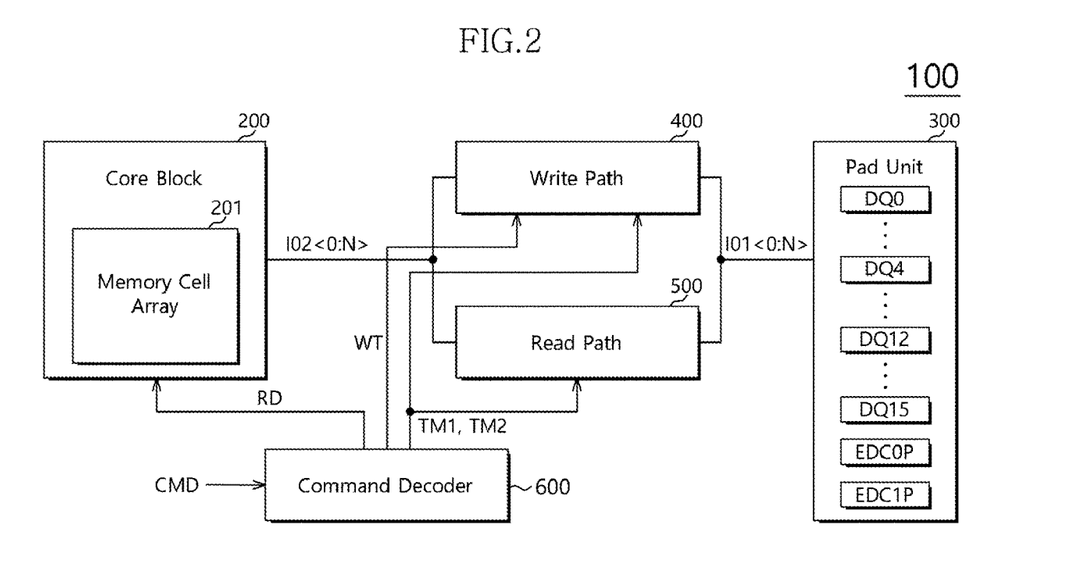
FIG. 2 illustrates the configuration of a semiconductor apparatus in accordance with an embodiment.

FIG. 2 illustrates the configuration of the semiconductor apparatus in accordance with an embodiment.

As illustrated in FIG. 2, the semiconductor apparatus 100 in accordance with an embodiment may include a core block 200, a pad unit 300, a write path 400, a read path 500 and a command decoder 600.

In an embodiment, the semiconductor apparatus 100 may include additional components for an operation of the semiconductor apparatus 100 as well as the above-described components, and the additional components may be configured in a similar manner to those of a general semiconductor apparatus.

The pad unit 300 may be coupled to the write path 400 and the read path 500 through first input and output (I/O) signal lines IO1<0:N>.

The write path 400 and the read path 500 may be coupled to the core block 200 through second I/O signal lines IO2<0:N>.

The core block 200 may further include a memory cell array 201 and components for data input/output of the memory cell array 201.

The core block 200 may output data written in the memory cell array 201 according to a read command RD.

The pad unit 300 may include data I/O pads, for example, a plurality of DQ pads DQ0 to DQ15 (i.e., data I/O pads) and a plurality of EDC pads EDC0P and EDC1P.

At this time, for example, since data which are simultaneously inputted or outputted through the plurality of DQ pads DQ0 to DQ15 of the pad unit 300 are 16 bits or 2 byte, the pads DQ0 to DQ7 may correspond to a first byte Byte0, and the other pads DQ8 to DQ15 may correspond to a second byte Byte1.

One pad for each byte in the semiconductor apparatus 100 may be coupled to the test equipment 101.

That is, one of the pads DQ0 to DQ7 corresponding to the first byte Byte0 and one of the pads DQ8 to DQ15 corresponding to the second byte Byte1 may be coupled to the test equipment 101. The pad coupled to the test equipment 101 among the pads DQ0 to DQ7, for example, the pad DQ4 may be referred to as a first test pad, and the pad coupled to the test equipment 101 among the pads DQ8 to DQ15, for example, the pad DQ12 may be referred to as a second test pad.

According to a write command WT and a first test command TM1, the write path 400 may copy first test data inputted through the first test pad DQ4 into signal paths of the other pads DQ0 to DQ3 and DQ5 to DQ7 corresponding to the first byte Byte0, and copy second test data inputted through the second test pad DQ12 into signal paths of the other pads DQ8 to DQ11 and DQ13 to DQ15 corresponding to the second byte Byte1, such that the first and second test data are written to the memory cell array 201 of the core block 200.

The first and second test data may have the same value.

According to a second test command TM2, the read path 500 may store EDCs which are internally generated and outputted through the plurality of EDC pads EDC0P and EDC1P, and compare the stored EDCs to each other. The read path 500 may output the comparison result signal through the first test pad DQ4.

The EDCs may be generated through an error detection operation on data which are outputted from the core block 200 according to the read command RD.

The read path 500 may generate compressed data by compressing the data outputted from the core block 200 according to the read command RD, and output the compressed data through the first test pad DQ4 according to the first test command TM1.

The command decoder 600 may generate the read command RD, the write command WT, the first test command TM1, the second test command TM2 and the like by decoding the command CMD provided from the test equipment 101.

Figure 3A:
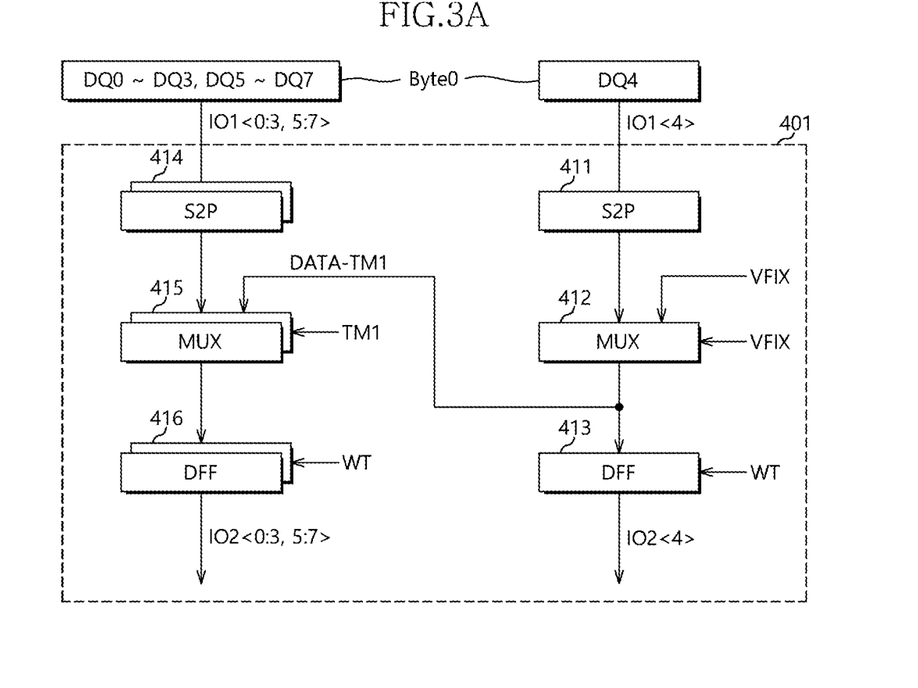
FIG. 3A illustrates the configuration of a first write path related to a first byte Byte0 in a write path of FIG. 2.

FIG. 3A illustrates the configuration of a first write path related to the first byte Byte0 in the write path of FIG. 2.

As illustrated in FIG. 3A, the first write path 401 may include write circuit sets coupled to the pads DQ0 to DQ7 corresponding to the first byte Byte0.

The write circuit sets may be coupled to the pads DQ0 to DQ7 corresponding to the first byte Byte0, respectively.

Each of the write circuit sets may include a deserializer S2P, a multiplexer MUX and a flip-flop DFF.

The deserializer S2P may convert an input signal, i.e. a serial input signal into a parallel signal, and output the parallel signal.

The multiplexer MUX may select one of first and second input signals and output the selected signal, according to a control signal.

The flip-flop DFF may latch and output an input signal according to the write command WT.

The write circuit sets may be configured in the same manner. For convenience of description, however, the write circuit set coupled to the first test pad DQ4 among the pads DQ0 to DQ7 corresponding to the first byte Byte0 may be represented by reference numerals 411 to 413, and the write circuit sets coupled to the other pads DQ0 to DQ3 to DQ5 to DQ7 may be represented by reference numerals 414 to 416.

The write circuit set coupled to the first test pad DQ4 may include a deserializer 411, a multiplexer 412 and a flip-flop 413.

The deserializer 411 may deserialize test data inputted from the first test pad DQ4 through the first I/O signal line IO1<4>, and output the deserialized data.

The multiplexer 412 may receive the output signal of the deserializer 411 as a first input, and receive a fixed voltage VFIX as a second input and the control signal.

As the fixed voltage VFIX, a ground voltage VSS may be used.

Therefore, the multiplexer 412 may select and output the output signal of the deserializer 411, that is, first test data DATA_TM1.

The flip-flop 413 may latch the first test data DATA_TM1 and output the latched data to the memory cell array 201 through the second I/O signal line IO2<4>, according to the write command WT.

The multiplexers 415 coupled to the other pads DQ0 to DQ3 and DQ5 to DQ7 corresponding to the first byte Byte0 except the first test pad DQ4 may select and output the first test data DATA_TM1 according to the first test command TM1.

The flip-flops 416 may latch the first test data DATA_TM1 and output the latched data to the memory cell array 201 through the second I/O signal lines IO2<0:3, 5:7>, according to the write command WT.

Through the operations of the multiplexers 415 and the flip-flops 416, the first test data DATA_TM1 inputted through the first test pad DQ4 may be copied into the signal paths of the other pads DQ0 to DQ3 and DQ5 to DQ7 corresponding to the first byte Byte0.

Figure 3B:
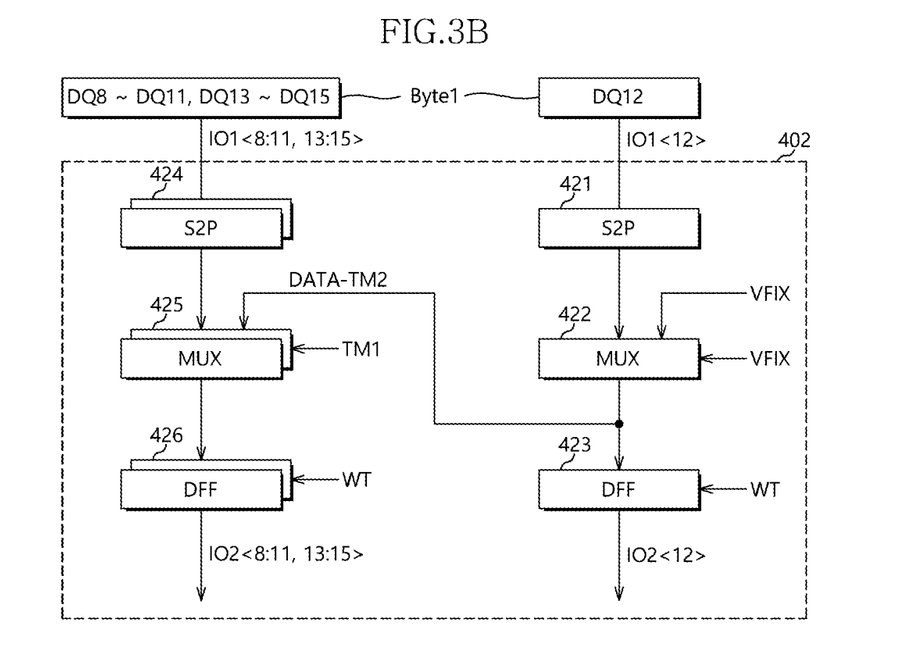
FIG. 3B illustrates the configuration of a second write path related to a second byte Byte1 in the write path of FIG. 2.

FIG. 3B illustrates the configuration of a second write path related to the second byte Byte1 in the write path of FIG. 2.

As illustrated in FIG. 3B, the second write path 402 may include write circuit sets coupled to the pads DQ8 to DQ15 corresponding to the second byte Byte1.

The write circuit sets may be coupled to the pads DQ8 to DQ15 corresponding to the second byte Byte1, respectively.

Each of the write circuit sets may include a deserializer S2P, a multiplexer MUX and a flip-flop DFF.

The write circuit sets may be configured in the same manner. For convenience of description, however, the write circuit set coupled to the second test pad DQ12 among the pads DQ8 to DQ15 corresponding to the second byte Byte1 may be represented by reference numerals 421 to 423, and the write circuit sets coupled to the other pads DQ8 to DQ11 to DQ13 to DQ15 may be represented by reference numerals 424 to 426.

The write circuit set coupled to the second test pad DQ12 may include a deserializer 421, a multiplexer 422 and a flip-flop 423.

The deserializer 421 may deserialize test data inputted from the second test pad DQ12 through the first I/O signal line IO1<12>, and output the deserialized data.

The multiplexer 422 may receive the output signal of the deserializer 421 as a first input, and receive the fixed voltage VFIX as a second input and the control signal.

As the fixed voltage VFIX, the ground voltage VSS may be used.

Therefore, the multiplexer 422 may select and output the output signal of the deserializer 421, that is, second test data DATA_TM2.

The flip-flop 423 may latch the second test data DATA_TM2 and output the latched data to the memory cell array 201 through the second I/O signal line IO2<12>, according to the write command WT.

The multiplexers 425 coupled to the other pads DQ8 to DQ11 to DQ13 to DQ15 corresponding to the second byte Byte1 except the second test pad DQ12 may select and output the second test data DATA_TM2 according to the first test command TM1.

The flip-flops 426 may latch the second test data DATA_TM2 and output the latched data to the memory cell array 201 through the second I/O signal lines IO2<8:11, 13:15>, according to the write command WT.

Through the operations of the multiplexers 425 and the flip-flops 426, the second test data DATA_TM2 inputted through the second test pad DQ12 may be copied into the signal paths of the other pads DQ8 to DQ11 to DQ13 to DQ15 corresponding to the second byte Byte1.

The second test data DATA_TM2 may have the same value as the first test data DATA TM1.

FIG. 3B illustrates that the first test pad DQ4 of the pads DQ0 to DQ7 corresponding to the first byte Byte0 and the second test pad DQ12 of the pads DQ8 to DQ15 corresponding to the second byte Byte1 among all the pads of the pad unit 300 are coupled to the test equipment 101.

Figure 4:
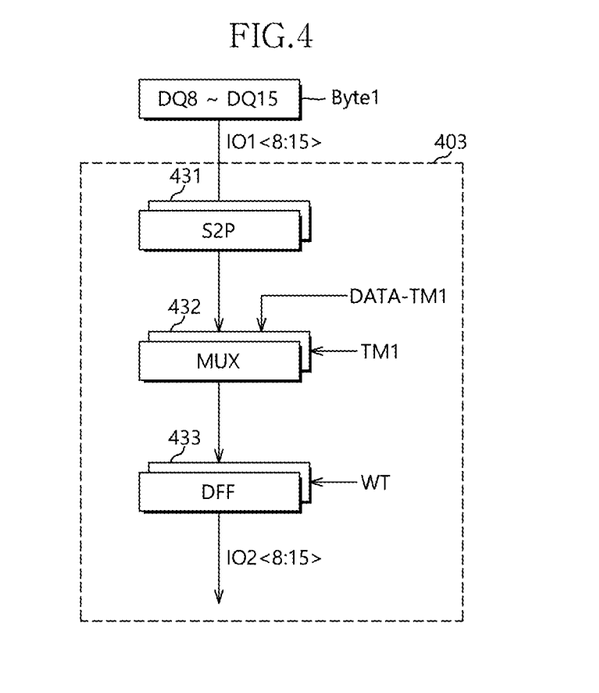
FIG. 4 illustrates another configuration example of the second write path related to the second byte Byte1 in the write path of FIG. 2.

The second write path related to the second byte Byte1 in the case that only one pad among all the pads of the pad unit 300, i.e. the first test pad DQ4 is coupled to the test equipment 101 may be configured as illustrated in FIG. 4.

FIG. 4 illustrates other configuration examples of the second write path related to the second byte Byte1 in the write path of FIG. 2.

As illustrated in FIG. 4, the second write path 403 may include the write circuit sets coupled to the pads DQ8 to DQ15 corresponding to the second byte Byte1.

The write circuit sets may be coupled to the pads DQ8 to DQ15 corresponding to the second byte Byte1, respectively.

Each of the write circuit sets may be configured in the same manner, and include a deserializer 431, a multiplexer 432 and a flip-flop 433.

The deserializer 431 may deserialize test data inputted through any one of the first I/O signal lines IO1<8:15>, and output the deserialized data.

The multiplexer 432 may select and output the first test data DATA_TM1 outputted from the multiplexer 412 of FIG. 3A according to the first test command TM1.

The flip-flop 433 may latch the first test data DATA_TM1 and output the latched data to the memory cell array 201 through any one of the second I/O signal lines IO2<8:15>, according to the write command WT.

Through the operations of the multiplexers 432 and the flip-flops 433, the first test data DATA_TM1 inputted through the first test pad DQ4 may be copied into the signal paths of the pads DQ8 to DQ15 corresponding to the second byte Byte1.

Figure 5:
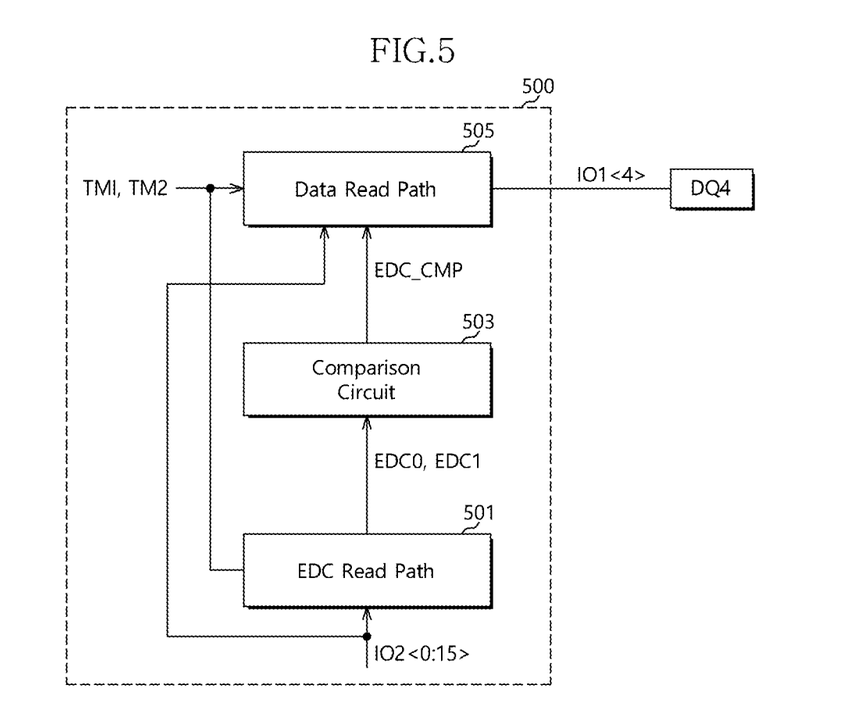
FIG. 5 illustrates the configuration of a read path of FIG. 2.

FIG. 5 illustrates the configuration of the read path of FIG. 2.

As illustrated in FIG. 5, the read path 500 may include an EDC read path 501, a comparison circuit 503 and a data read path 505.

The EDC read path 501 may generate EDCs EDC0 and EDC1 by performing an error detection operation on data which are outputted from the core block 200 through the second I/O signal lines IO2<0:15> according to the read command RD, and store the generated EDCs EDC0 and EDC1 according to the second test command TM2.

The comparison circuit 503 may generate a comparison result signal EDC_CMP by comparing the EDCs EDC0 and EDC1 stored in the EDC read path 501.

The comparison circuit 503 may be implemented with a general comparator.

The data read path 505 may generate compressed data by compressing the data outputted from the core block 200 through the second I/O signal lines IO2<0:15> according to the read command RD, and output the compressed data through the first test pad DQ4 according to the first test command TM1 or output the comparison result signal EDC_CMP through the first test pad DQ4 according to the second test command TM2.

Figure 6A:
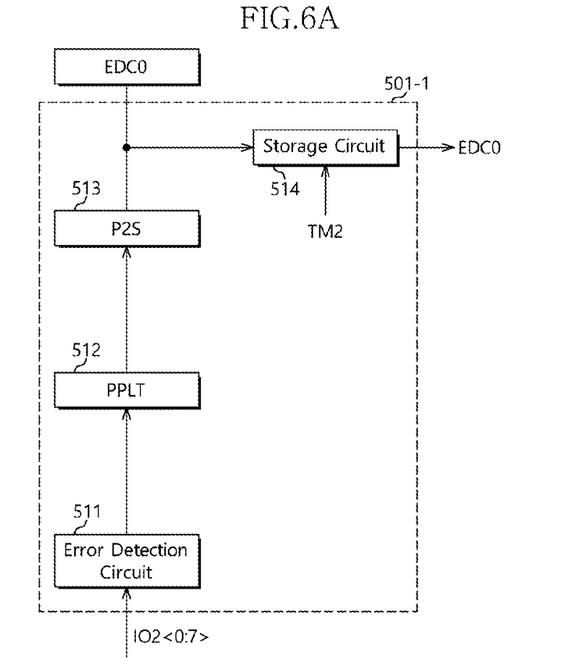
FIG. 6A illustrates the configuration of a first EDC read path related to the first byte Byte0 in an EDC read path of FIG. 5.

FIG. 6A illustrates the configuration of a first EDC read path related to the first byte Byte0 in the EDC read path of FIG. 5.

As illustrated in FIG. 6A, the first EDC read path 501-1 may include an error detection circuit 511, a pipe latch (PPLT) 512, a serializer (P2S) 513 and a storage circuit 514.

The error detection circuit 511 may generate a first EDC EDC0 by performing an error detection operation on first data outputted through the second I/O signal lines IO2<0:7> corresponding to the first byte Byte0.

The pipe latch 512 may latch an output of the error detection circuit 511.

The serializer 513 may serialize an output of the pipe latch 512, and output the serialized signal to the EDC pad EDC0P.

The storage circuit 514 may store the output of the serializer 513, which is transferred to the EDC pad EDC0P, according to the second test command TM2.

Figure 6B:
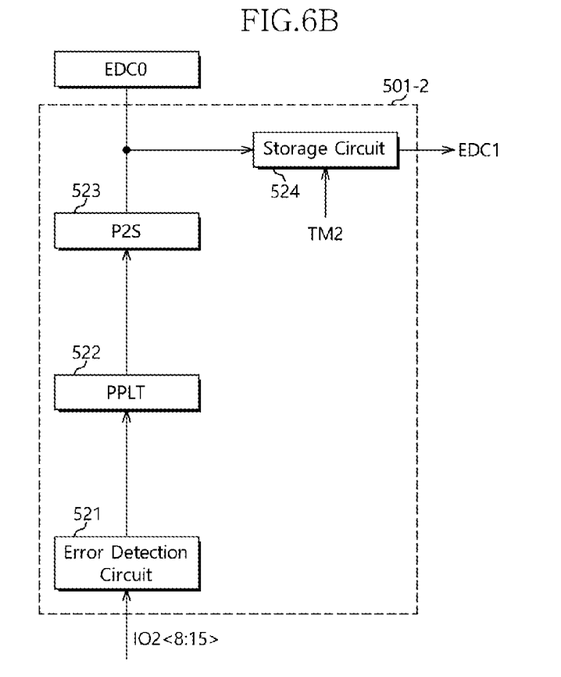
FIG. 6B illustrates the configuration of a second EDC read path related to the second byte Byte1 in the EDC read path of FIG. 5.

FIG. 6B illustrates the configuration of a second EDC read path related to the second byte Byte1 in the EDC read path of FIG. 5.

As illustrated in FIG. 6B, the second EDC read path 501-2 may include an error detection circuit 521, a pipe latch 522, a serializer 523 and a storage circuit 524.

The error detection circuit 521 may generate a second EDC EDC1 by performing an error operation on second data outputted through the second I/O signal lines IO2<8:15> corresponding to the second byte Byte1.

The pipe latch 522 may latch an output of the error detection circuit 521.

The serializer 523 may serialize an output of the pipe latch 522, and output the serialized signal to the EDC pad EDC1P.

The storage circuit 524 may store the output of the serializer 523, which is transferred to the EDC pad EDC1P, according to the second test command TM2.

Figure 7A:
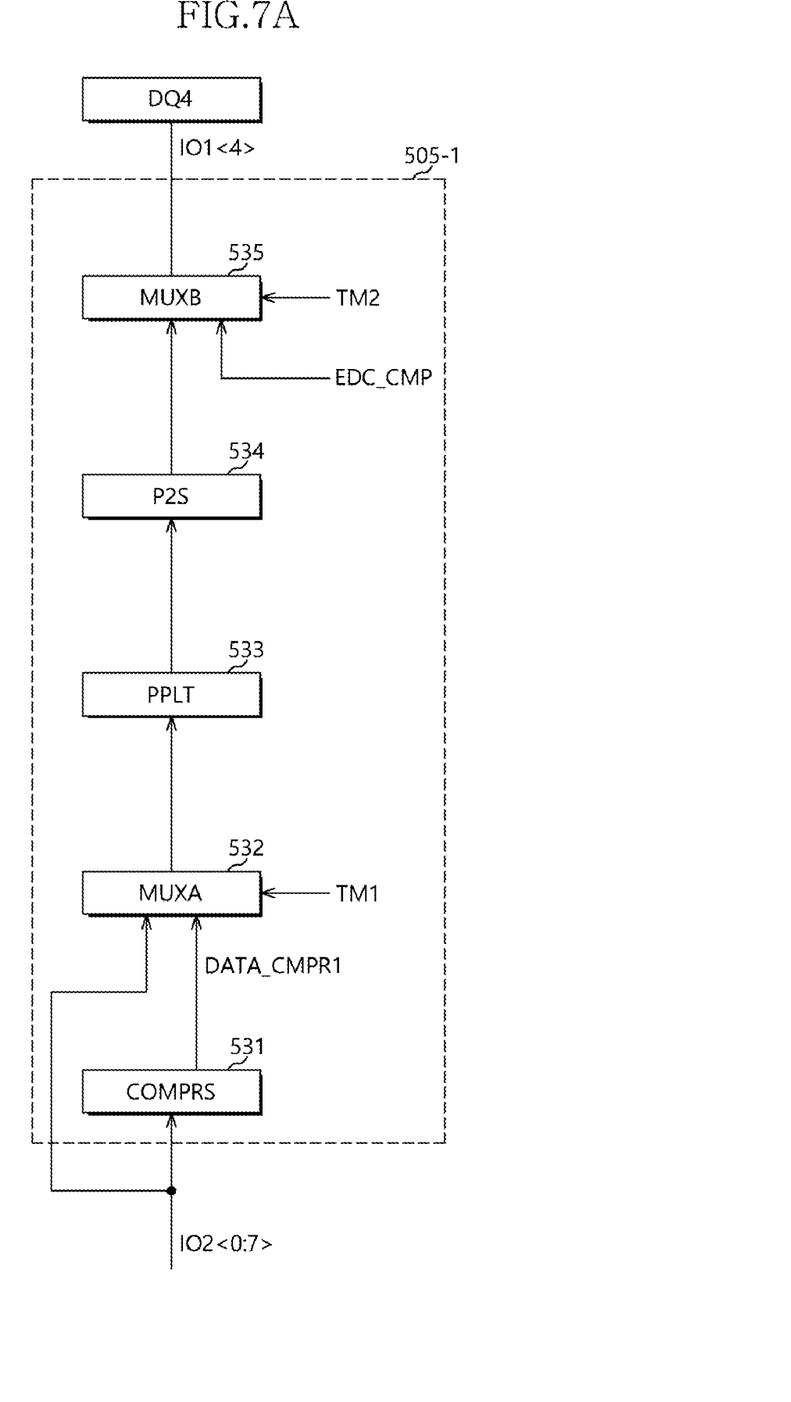
FIG. 7A illustrates the configuration of a first data read path related to the first byte Byte0 in a data read path of FIG. 5.

FIG. 7A illustrates the configuration of a first data read path related to the first byte Byte0 in the data read path of FIG. 5.

As illustrated in FIG. 7A, the first data read path 505-1 may include a data compression circuit (COMPRS) 531, a first multiplexer (MUXA) 532, a pipe latch (PPLT) 533, a serializer (P2S) 534 and a second multiplexer (MUXB) 535.

The data compression circuit 531 may generate compressed data, i.e. first compressed data DATA_CMPR1 by compressing data outputted through the second I/O signal lines IO2<0:7> corresponding to the first byte Byte0.

The first multiplexer 532 may select and output the data outputted through the second I/O signal lines IO2<0:7> or the first compressed data DATA_CMPR1 according to the first test command TM1.

The first multiplexer 532 may select and output the first compressed data DATA_CMPR1 when the first test command TM1 is at an active level (for example, high level), or select and output the data outputted through the second I/O signal lines IO2<0:7> when the first test command TM1 is at an inactive level (for example, low level).

The pipe latch 533 may latch the output of the first multiplexer 532.

The serializer 534 may serialize the output of the first multiplexer 532.

The second multiplexer 535 may select an output of the serializer 534 or the comparison result signal EDC_CMP and output the selected signal to the first test pad DQ4, according to the second test command TM2.

The second multiplexer 535 may select the comparison result signal EDC_CMP and output the selected signal to the first test pad DQ4 when the second test command TM2 is at an active level (for example, high level), or select the output of the serializer 534 and output the selected signal to the first test pad DQ4 when the second test command TM2 is at an inactive level (for example, low level).

Figure 7B:
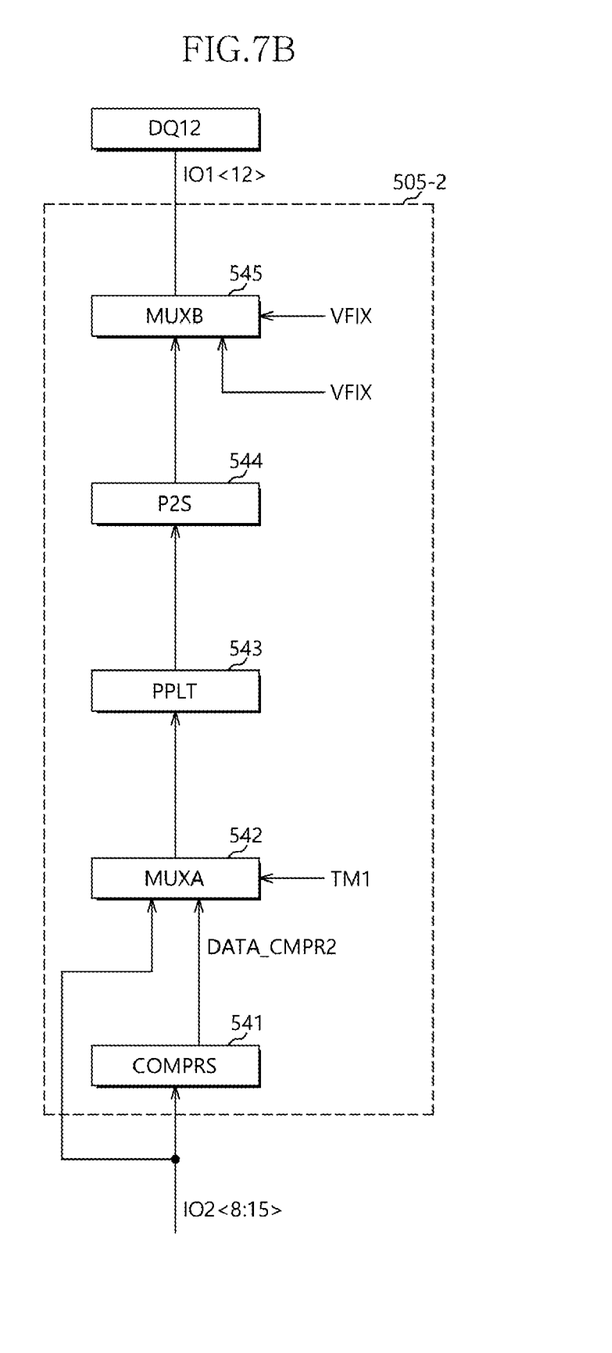
FIG. 7B illustrates the configuration of a second data read path related to the second byte Byte1 in the data read path of FIG. 5.

FIG. 7B illustrates the configuration of a second data read path related to the second byte Byte1 in the data read path of FIG. 5.

As illustrated in FIG. 7B, the second data read path 505-2 may include a data compression circuit 541, a first multiplexer 542, a pipe latch 543, a serializer 544 and a second multiplexer 545.

The data compression circuit 541 may generate compressed data, i.e. second compressed data DATA_CMPR2 by compressing data outputted through the second I/O signal lines IO2<8:15> corresponding to the second byte Byte1.

The first multiplexer 542 may select and output the data outputted through the second I/O signal lines IO2<8:15> or the second compressed data DATA_CMPR2 according to the first test command TM1.

The first multiplexer 542 may select and output the second compressed data DATA_CMPR2 when the first test command TM1 is at an active level (for example, high level), and select and output the data outputted through the second I/O signal lines IO2<8:15> when the first test command TM1 is at an inactive level (for example, low level).

The pipe latch 543 may latch the output of the first multiplexer 542.

The serializer 544 may serialize the output of the first multiplexer 542.

At this time, since the comparison result signal EDC_CMP is outputted through the second multiplexer 535 of FIG. 7A, the second multiplexer 545 does not need to output the comparison result signal EDC_CMP. Therefore, the second multiplexer 545 may be configured in order for the second data read path 505-2 to have the same signal processing delay as the first data read path 505-1 of FIG. 7A.

The second multiplexer 545 may receive an output of the serializer 544 as a first input, and receive the fixed voltage VFIX as a second input and the control signal.

As the fixed voltage VFIX, the ground voltage VSS may be used.

Therefore, the second multiplexer 545 may select the output of the serializer 544 regardless of the second input, and output the selected signal to the second test pad DQ12.

Referring to FIGS. 1 to 7, a test method of the semiconductor apparatus having the above-described configuration in accordance with an embodiment will be described as follows.

As described above, the test equipment 101 and the semiconductor apparatus 100 may be coupled to each other through only the first test pad DQ4 or one DQ pad for each byte, for example, the first test pad DQ4 and the second test pad DQ12 among the DQ pads. For example, suppose that the test equipment 101 and the semiconductor apparatus 100 are coupled to each other through only the first test pad DQ4.

The test equipment 101 may transfer test data through the first test pad DQ4 coupled to the semiconductor apparatus 100, and transfer the write command WT and the first test command TM1 to the semiconductor apparatus 100.

The semiconductor apparatus 100 may copy the test data transferred through the first test pad DQ4 into the other DQ pads to write the test data to the memory cell array 201, according to the write command WT and the first test command TM1.

When the read command RD is inputted from the test equipment 101, the semiconductor apparatus 100 may perform an error detection operation for each byte on data outputted from the memory cell array 201, and generate the first EDC EDC0 based on the first byte Byte0 and the second EDC EDC1 based on the second byte Byte1.

The semiconductor apparatus 100 may generate the comparison result signal EDC_CMP by comparing the first and second EDCs EDC0 and EDC1.

The semiconductor apparatus 100 may transfer the comparison result signal EDC_CMP to the test equipment 101 through the first test pad DQ4 according to the second test command TM2.

The test equipment 101 may not be coupled to the EDC pads, but receive the comparison result signal EDC_CMP through the first test pad DQ4 and verify a pass/fail of the error detection operation of the semiconductor apparatus 100.

At this time, the test data transferred through the first test pad DQ4 may be copied into the other DQ pads and written to the memory cell array 201, according to the write command WT. That is, the same data may be written to the memory cell array 201 through the respective DQ pads.

Therefore, the first EDC EDC0 and the second byte Byte1 need to have the same value, and the comparison result signal EDC_CMP obtained by comparing the first EDC EDC0 and the second byte Byte1 needs to have a level defining that the first EDC EDC0 and the second byte Byte1 have the same value.

When the error detection circuit 511 of FIG. 6A, the error detection circuit 521 of FIG. 6B and the corresponding signal paths are abnormal, the comparison result signal EDC_CMP may be outputted as a level defining that the first EDC EDC0 and the second byte Byte1 are not equal to each other.

Therefore, the test equipment 101 may verify a pass/fail of the error detection operation of the semiconductor apparatus 100 according to the comparison result signal EDC_CMP.

While various embodiments have been described above, it will be understood to those skilled in the art that the embodiments described are examples only. Accordingly, the semiconductor apparatus and the test system, which are described herein, should not be limited based on the described embodiments.

What is claimed is:

1. A semiconductor apparatus comprising:
   a pad unit comprising a plurality of data input and output pads and a plurality of error detection code pads;
   an error detection code read path configured to generate a plurality of error detection codes by performing an error detection operation on a plurality of data, and output the plurality of error detection codes through the plurality of error detection code pads;
   a comparison circuit configured to generate a comparison result signal by comparing the plurality of error detection codes; and
   a data read path configured to output the comparison result signal through any one of the plurality of data input and output pads,
   wherein the data read path generates a plurality of compressed data by compressing the plurality of data, and outputs the plurality of compressed data through any one of the plurality of data input and output pads,
   wherein the data read path comprises:
   a first data compression circuit configured to generate first compressed data by compressing first data among the plurality of data;
   a first multiplexer configured to select and output the first data or the first compressed data according to a first test command; and
   a second multiplexer configured to select the output of the first multiplexer or the comparison result signal and output the selected signal through a first test pad among the plurality of data input and output pads, according to a second test command.

2. The semiconductor apparatus according to claim 1, wherein the data read path is configured to output the comparison result signal through the any one of the plurality of data input and output pads according to a test command.

3. The semiconductor apparatus according to claim 1, wherein the error detection code read path comprises:
   a first error detection circuit configured to generate a first error detection code by performing an error detection operation on first data among the plurality of data, and transfer the first error detection code to a first error detection code pad;
   a first storage circuit configured to store the first error detection code and transfer the stored first error detection code to the comparison circuit, according to a test command;
   a second error detection circuit configured to generate a second error detection code by performing an error detection operation on second data among the plurality of data, and transfer the second error detection code to a second error detection code pad; and
   a second storage circuit configured to store the second error detection code and transfer the stored second error detection code to the comparison circuit, according to the test command.

4. A semiconductor apparatus comprising:
   a memory cell array;
   a pad unit comprising a plurality of data input and output pads and first and second error detection code pads;
   a write path configured to copy first test data inputted through a first test pad among the plurality of data input and output pads into signal paths of the other pads to write the first test data to the memory cell array, according to a write command and a first test command; and a read path configured to generate first and second error detection codes through error detection operations on first and second data outputted from the memory cell array according to a read command, output the first and second error detection codes through the first and second error detection code pads, generate a comparison result signal by storing and comparing the first and second error detection codes according to a second test command, and output the comparison result signal through the first test pad, wherein the read path comprises:

an error detection code read path configured to generate the first and second error detection codes and output the first and second error detection codes through the first and second error detection code pads, respectively;

a comparison circuit configured to generate the comparison result signal by comparing the first and second error detection codes; and a data read path configured to output the comparison result signal through the first test pad according to the second test command, wherein the data read path generates a plurality of compressed data by compressing the first and second data, and outputs the plurality of compressed data through the first test pad, wherein the data read path comprises:

a first data compression circuit configured to generate first compressed data by compressing the first data;

a first multiplexer configured to select and output the first data or the first compressed data according to the first test command; and a second multiplexer configured to select the output of the first multiplexer or the comparison result signal and output the selected signal through the first test pad, according to the second test command.

5. The semiconductor apparatus according to claim 4, wherein the error detection code read path comprises:

a first error detection circuit configured to generate the first error detection code by performing an error detection operation on the first data, and transfer the first error detection code to the first error detection code pad;

a first storage circuit configured to store the first error detection code and transfer the stored first error detection code to the comparison circuit, according to the second test command;

a second error detection circuit configured to generate the second error detection code by performing an error detection operation on the second data, and transfer the second error detection code to the second error detection code pad; and a second storage circuit configured to store the second error detection code and transfer the stored second error detection code to the comparison circuit, according to the second test command.

6. A test system comprising:

test equipment configured to provide a plurality of commands and test data; and a semiconductor apparatus comprising a plurality of data input and output pads and first and second error detection code pads, and configured to receive the test data through a first test pad coupled to the test equipment among the plurality of data input and output pads, write the received test data to a memory cell array, generate a plurality of error detection codes by performing error detection operations on a plurality of data outputted from the memory cell array, respectively, and transfer a result obtained by comparing the plurality of error detection codes to the test equipment through the first test pad, wherein the semiconductor apparatus comprises:

a write path configured to copy first test data inputted through the first test pad into signal paths of the other pads to write the first test data to the memory cell array, according to a write command and a first test command; and a read path configured to generate first and second error detection codes through error detection operations on first and second data outputted from the memory cell array according to a read command, output the first and second error detection codes through the first and second error detection code pads, generate a comparison result signal by storing and comparing the first and second error detection codes according to a second test command, and output the comparison result signal through the first test pad, wherein the read path comprises:

an error detection code read path configured to generate the first and second error detection codes and output the first and second error detection codes through the first and second error detection code pads;

a comparison circuit configured to generate the comparison result signal by comparing the first and second error detection codes; and a data read path configured to output the comparison result signal through the first test pad according to the second test command, wherein the data read path generates a plurality of compressed data by compressing the first and second data, and outputs the plurality of compressed data through the first test pad, wherein the data read path comprises:

a first data compression circuit configured to generate first compressed data by compressing the first data;

a first multiplexer configured to select and output the first data or the first compressed data according to the first test command; and a second multiplexer configured to select the output of the first multiplexer or the comparison result signal and output the selected signal through the first test pad, according to the second test command.

7. The test system according to claim 6, wherein the semiconductor apparatus further comprises a plurality of error detection code pads configured to output the plurality of error detection codes to the outside, and the plurality of error detection code pads are not coupled to the test equipment.

8. The test system according to claim 6, wherein the error detection code read path comprises:

a first error detection circuit configured to generate the first error detection code by performing an error detection operation on the first data, and transfer the first error detection code to the first error detection code pad;

a first storage circuit configured to store the first error detection code and transfer the stored first error detection code to the comparison circuit, according to the second test command;

a second error detection circuit configured to generate the second error detection code by performing an error detection operation on the second data, and transfer the second error detection code to the second error detection code pad; and a second storage circuit configured to store the second error detection code and transfer the stored second error detection code to the comparison circuit, according to the second test command.

\* \* \* \* \*